United States Patent
Jang et al.

(10) Patent No.: US 7,601,583 B2
(45) Date of Patent: Oct. 13, 2009

(54) TRANSISTOR STRUCTURE OF MEMORY DEVICE AND METHOD FOR FABRICATING THE SAME

(75) Inventors: Se Aug Jang, Icheon-si (KR); Yong Soo Kim, Suwon-si (KR); Jae Geun Oh, Icheon-si (KR); Jae Sung Rohh, Gwacheon-si (KR); Hyun Chul Sohn, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 20 days.

(21) Appl. No.: 11/962,100

(22) Filed: Dec. 21, 2007

(65) Prior Publication Data
US 2008/0096355 A1    Apr. 24, 2008

Related U.S. Application Data

(62) Division of application No. 11/201,951, filed on Aug. 10, 2005, now Pat. No. 7,332,755.

(30) Foreign Application Priority Data
Apr. 29, 2005    (KR)    ...................... 10-2005-0036056

(51) Int. Cl.
  *H01L 29/72* (2006.01)
(52) U.S. Cl. ...................... 438/231; 438/163; 438/197; 438/221; 438/225; 438/300; 438/283; 438/585; 438/700; 438/735 H

(58) Field of Classification Search ................. 438/163, 438/197, 221, 225, 231, 283, 585, 700, 735
See application file for complete search history.

(56) References Cited

U.S. PATENT DOCUMENTS

2006/0286740 A1* 12/2006  Lin et al. ................... 438/231

FOREIGN PATENT DOCUMENTS

| JP | 2004-281761 A | 10/2004 |
| JP | 2005-086024 A | 3/2005 |
| KR | 10-2004-0091309 A | 10/2004 |
| KR | 10-2005-0099330 A | 10/2005 |

\* cited by examiner

*Primary Examiner*—Edward Wojciechowicz
(74) *Attorney, Agent, or Firm*—Townsend and Townsend and Crew LLP

(57) ABSTRACT

A memory device includes an active area protruding from a semiconductor substrate. A recess is formed in the active area. A field oxide layer is formed on the semiconductor substrate. A gate electrode extends across the active area while being overlapped with the recess. A gate insulation layer is interposed between the gate electrode and the active area. Source and drain areas are formed in the active area. The transistor structure above defines a recessed transistor structure if it is sectioned along a source-drain line and defines a Fin transistor structure if it is sectioned along a gate line. The transistor structure ensures sufficient data retention time and improves the current drivability while lowering the back bias dependency of a threshold voltage.

12 Claims, 11 Drawing Sheets

US 7,601,583 B2

TRANSISTOR STRUCTURE OF MEMORY DEVICE AND METHOD FOR FABRICATING THE SAME

BACKGROUND OF THE INVENTION

1. Field of the Invention

The present invention relates to a semiconductor device and a method for fabricating the same. More particularly, the present invention relates to a transistor structure of a memory device having advantages of a recessed transistor and Fin transistor, and a method for fabricating the same.

2. Description of the Prior Art

Recently, as semiconductor devices have been highly integrated, channel lengths and channel widths of the semiconductor devices have significantly shortened. For this reason, it is difficult for conventional two-dimensional transistor structures to ensure sufficient data retention times due to the junction leakage current caused by high-density doping. In addition, the conventional two-dimensional transistor structures present limitations in view of current drivability of the highly integrated memory devices.

FIG. 1 shows a conventional recessed transistor structure, which has been suggested to ensure sufficient data retention time for a highly integrated memory device. In FIG. 1, reference numerals 1 to 4 represent a semiconductor substrate, a field oxide layer, a gate insulation layer, and a gate electrode, respectively. In addition, reference characters S and D represent source and drain areas, and reference character C represents a channel area, respectively.

According to the conventional recessed transistor structure shown in FIG. 1, a recess having a predetermined depth is formed in the semiconductor substrate 1 in such a manner that the source/drain areas can be maximally spaced from the channel area.

If the recessed transistor is used as a transistor of a memory device (for example, a DRAM), the junction leakage current of the memory device can be significantly reduced in comparison with that of a memory device employing a two-dimensional transistor as a transistor. Accordingly, the recessed transistor ensures sufficient data retention time, which may be twice as long as the conventional data retention time.

However, the conventional recessed transistor structure presents problems in that it causes a higher back bias dependency of a threshold voltage and inferior current drivability.

FIGS. 2A and 2B are views illustrating a conventional Fin transistor structure configured to improve current drivability of a highly integrated memory device, wherein FIG. 2A is a perspective view of the conventional Fin transistor structure and FIG. 2B is a sectional view taken along lines X-X' and Y-Y' shown in FIG. 2A. In FIGS. 2A and 2B, reference numerals 11 to 14 represent a semiconductor substrate, a field oxide layer, a gate insulation layer, and a gate electrode made from polysilicon, respectively. In addition, reference characters S and D represent source and drain areas and reference characters C1 to C3 represent channel areas, respectively.

According to the conventional Fin transistor structure shown in FIGS. 2A and 2B, a channel area (that is, an active area 11a) of the semiconductor substrate 11 is vertically protruded and the gate insulation layer 13 and the gate electrode 14 are sequentially formed on the active area 11a. Thus, three surfaces (C1, C2 and C3 of FIG. 2b) of the substrate 11 surrounded by the gate electrode 14 can be used as channels of a Fin transistor.

If the Fin transistor is used as a transistor of a memory device (for example, a DRAM), the amount of current flowing through the Fin transistor may increase because three surfaces of the Fin transistor can be used as channels so that the current drivability of the memory device can be significantly improved. In particular, since the Fin transistor contains superior ON-OFF characteristics while lowering the back bias dependency of a threshold voltage, the Fin transistor may represent a high speed memory device with superior device characteristics at a low voltage.

However, the conventional Fin transistor structure presents a fatal problem because it cannot ensure sufficient data retention times due to a structural problem thereof. In other words, it is predicted that a source of the junction leakage current may be significantly enlarged due to the triple channels formed in a narrow area.

Moreover, if the gate electrode is employed in a low-resistant gate electrode structure required for a highly integrated memory device, in which the low-resistant gate electrode structure further includes a low-resistant conductive layer made from WSix or W and deposited on a polysilicon conductive layer, not only is it difficult to ensure sufficient data retention times, but also the resistance of the gate electrode is suddenly increased due to defects (for example, voids) created when fabricating the low-resistant gate electrode structure, thereby causing additional problems.

Such defects may occur when depositing the low-resistant conductive layer made from WSix or W onto the polysilicon conductive layer because there is a step difference between the active area 11a vertically protruding from the semiconductor substrate 11 and the field oxide layer 12.

SUMMARY OF THE INVENTION

Accordingly, the present invention relates to providing a transistor structure of a memory device having advantages of a recessed transistor and a Fin transistor by integrating the recessed transistor and the Fin transistor as one transistor in such a manner that the transistor structure not only ensures sufficient data retention times, but also improves the current drivability while lowering the back bias dependency of a threshold voltage.

One embodiment of the present invention is directed to providing a method for effectively fabricating the transistor having the above structure.

Another embodiment of the present invention is directed to providing a method for fabricating a transistor of a memory device capable of preventing resistance of a gate electrode from being increased by restricting voids created when a low-resistant gate electrode is fabricated.

According to one aspect of the present invention, there is provided a transistor structure of a memory device, the transistor structure comprising: an active area protruding from a predetermined portion of a semiconductor substrate; a recess formed in a channel area provided in the active area; a field oxide layer formed on the semiconductor substrate in such a manner that the field oxide layer is positioned lower than an upper surface of the active area including the recess; a gate electrode extending across an upper portion of the active area while being overlapped with the recess; a gate insulation layer interposed between the gate electrode and the active area; and source and drain areas formed in the active area at both sides of the gate electrode, wherein the transistor structure represents a recessed transistor structure if it is sectioned along a source-drain line, and represents a Fin transistor structure if it is sectioned along a gate line.

According to the preferred embodiment of the present invention, the gate electrode includes a poly gate electrode or a low-resistant gate electrode. The low-resistant gate electrode includes a first conductive layer made from polysilicon and a second conductive layer made from a low-resistant material and deposited on the first conductive layer. The second conductive layer is made from one selection from the group consisting of W, WN, WSix and TiSix.

According to one aspect of the present invention, there is provided a method for fabricating a transistor structure of a memory device, the method comprising the steps of: forming an active area protruding from a predetermined portion of a semiconductor substrate by etching the semiconductor substrate; forming a field oxide layer defining the active area in the semiconductor substrate; forming a recess in a channel area provided in the active area; etching the field oxide layer in such a manner that the field oxide layer is positioned lower than an upper surface of the active area including the recess; forming a gate insulation layer on the active area in which the recess and the upper surface of the active area are exposed to an exterior; and forming a gate electrode on the gate insulation layer and the field oxide layer in such a manner that the gate electrode extends across an upper portion of the active area while being overlapped with the recess. As a result, a recessed transistor structure and a Fin transistor structure can be integrated in one transistor structure of the memory device.

According to the preferred embodiment of the present invention, a process step of forming the field oxide layer is interchangeable with a process step of forming the recess. The field oxide layer has a thickness of about 2000 to 6000 Å. The recess formed in the active area has a depth corresponding to ⅓ of an initial thickness of the field oxide layer and the field oxide layer is etched in such a manner that the field oxide layer has a thickness corresponding to ⅓ of the initial thickness of the field oxide layer.

The gate electrode includes a poly gate electrode or a low-resistant gate electrode including a first conductive layer made from polysilicon and a second conductive layer made from a low-resistant material, such as W, WN, WSix and TiSix, and deposited on the first conductive layer.

The poly gate electrode is fabricated by performing the steps of forming a conductive layer on the gate insulation layer and etching a predetermined portion of the conductive layer.

In contrast, the low-resistant gate electrode is fabricated by performing the steps of forming a first conductive layer made from polysilicon on the gate insulation layer, planarizing the first conductive layer through a chemical mechanical polishing process, forming a second conductive layer made from a low-resistant material on the planarized first conductive layer, and sequentially etching predetermined portions of the first and second conductive layers. At this time, the first conductive layer has a thickness larger than a thickness of the active area which is exposed to an exterior after the field oxide layer has been etched. In addition, the first conductive layer is planarized in such a manner that the first conductive layer having a thickness of about 300 to 1500 Å remains on the upper surface of the active area.

According to one embodiment of the present invention, if the memory device includes the transistor having the above structure, the memory device represents advantages of the recessed transistor and the Fin transistor. In addition, since the low-resistant gate electrode is fabricated by depositing the second conductive layer made from the low-resistant material on the first conductive layer made from polysilicon after planarizing the first conductive layer, voids cannot be formed in the gate electrode.

BRIEF DESCRIPTION OF THE DRAWINGS

The above and other features and advantages of the present invention will be more apparent from the following detailed description taken in conjunction with the accompanying drawings, in which:

FIG. 2B is a sectional view taken along lines X and X' and Y-Y' shown in FIG. 2a;

DETAILED DESCRIPTION OF THE PREFERRED EMBODIMENTS

Hereinafter, the present invention will be described with reference to accompanying drawings.

FIGS. 3A to 3F are views illustrating a process for fabricating a unit transistor having a poly gate electrode according to a first embodiment of the present invention. Hereinafter, a method for fabricating the unit transistor will be described in detail with reference to FIGS. 3a to 3f.

Figure 1:
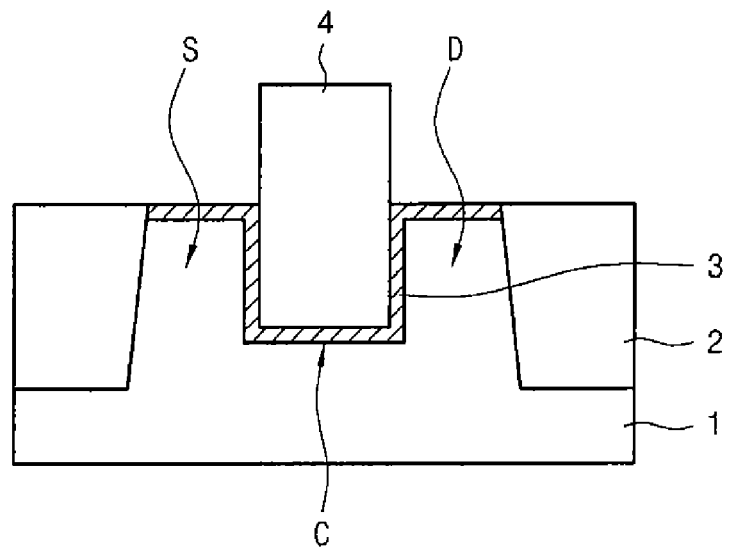
FIG. 1 is a sectional view illustrating a conventional recessed transistor structure.
Figure 2A:
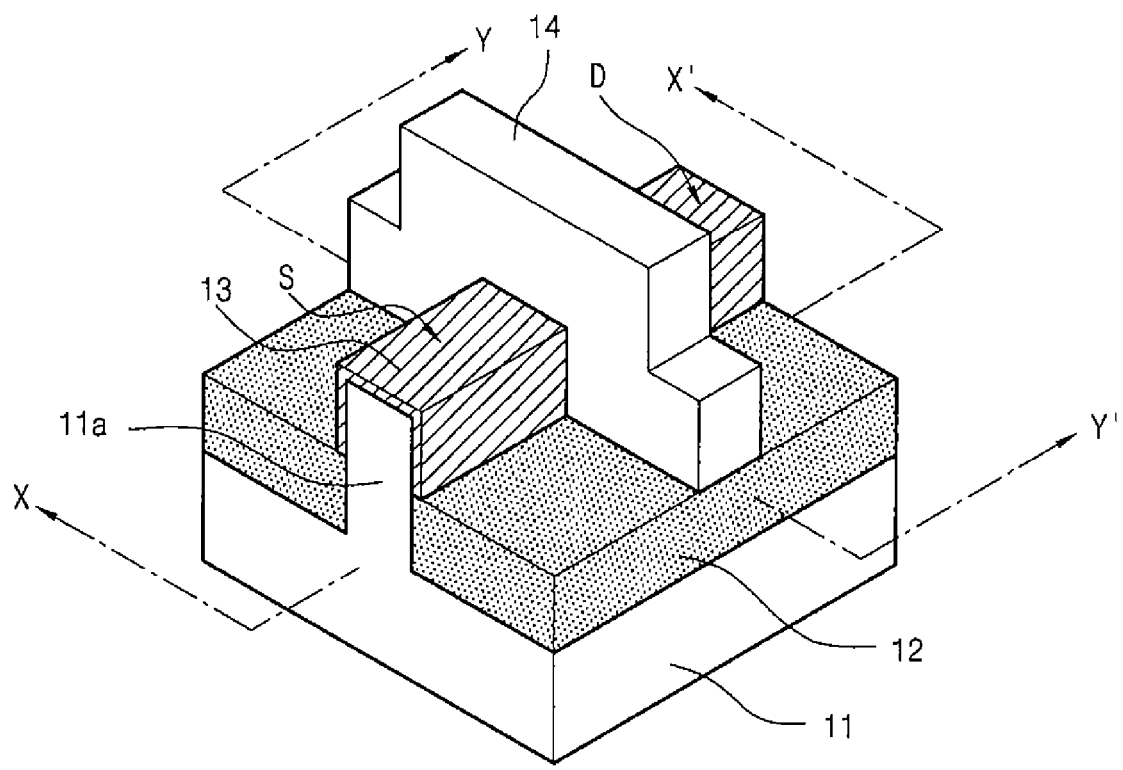
FIG. 2A is a perspective view illustrating a conventional Fin transistor structure having a poly gate electrode.
Figure 2B:
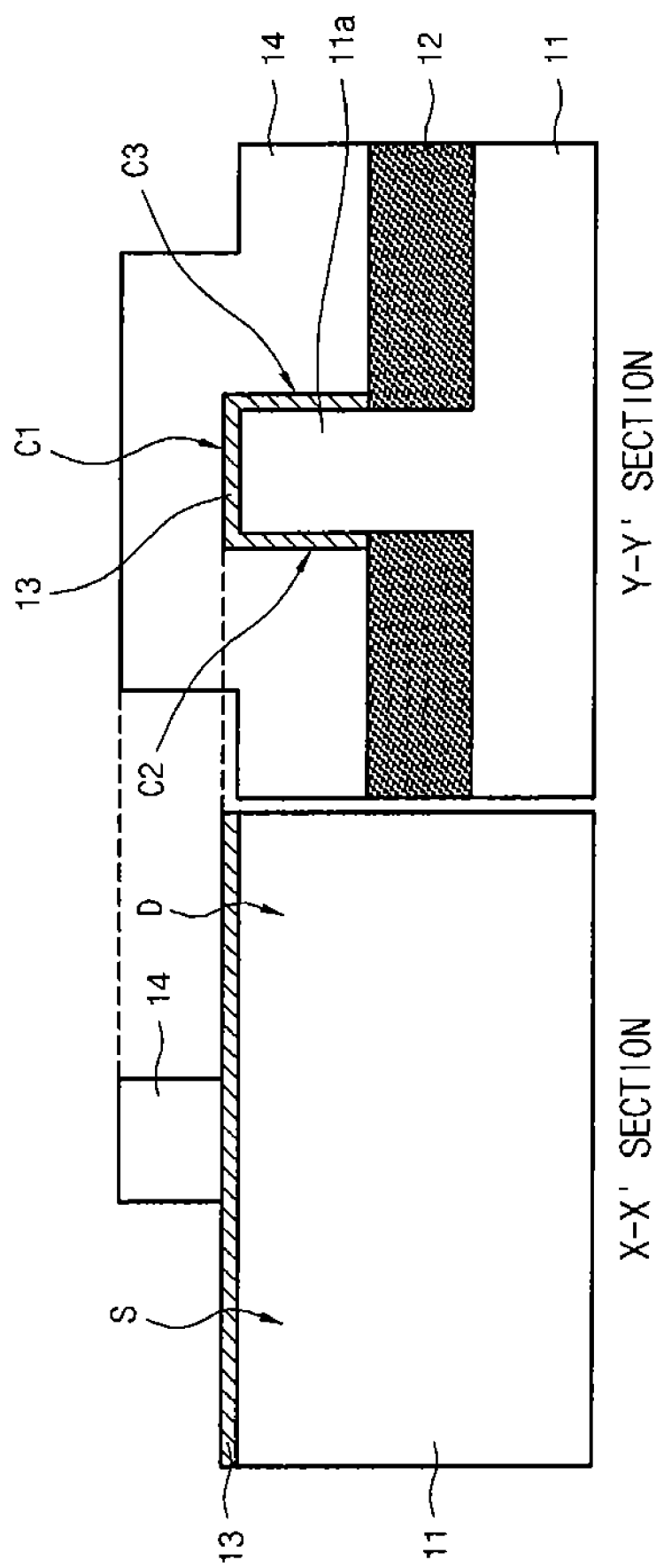
Figure 3A:
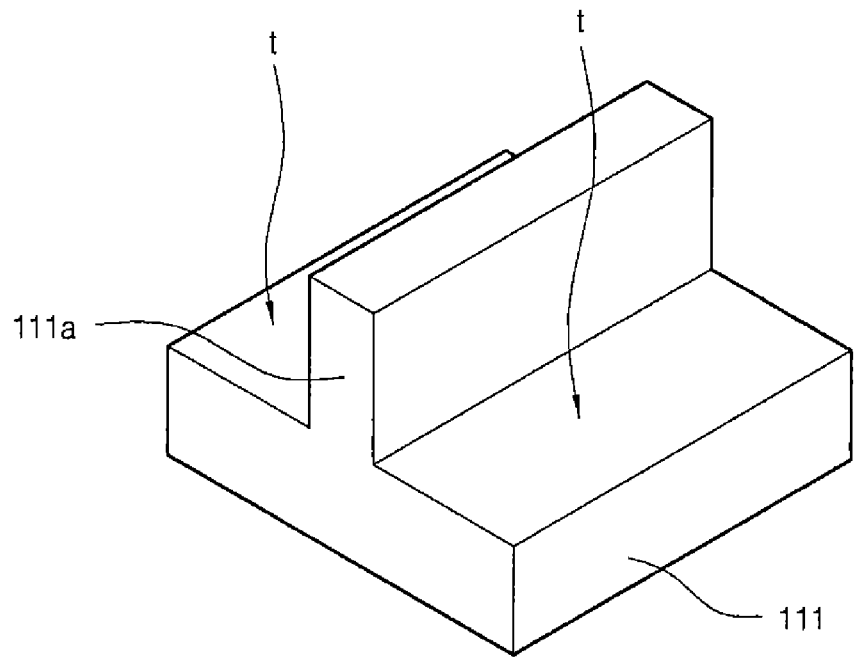
FIGS. 3A to 3F are views illustrating a process procedure for fabricating a unit transistor having a poly gate electrode according to a first embodiment of the present invention.

As shown in FIG. 3A, a trench t is formed in a semiconductor substrate 111 by etching a predetermined portion of the semiconductor substrate 111. As a result, an active area 111a protrudes from a predetermined portion of the semiconductor substrate 111.

Figure 3B:
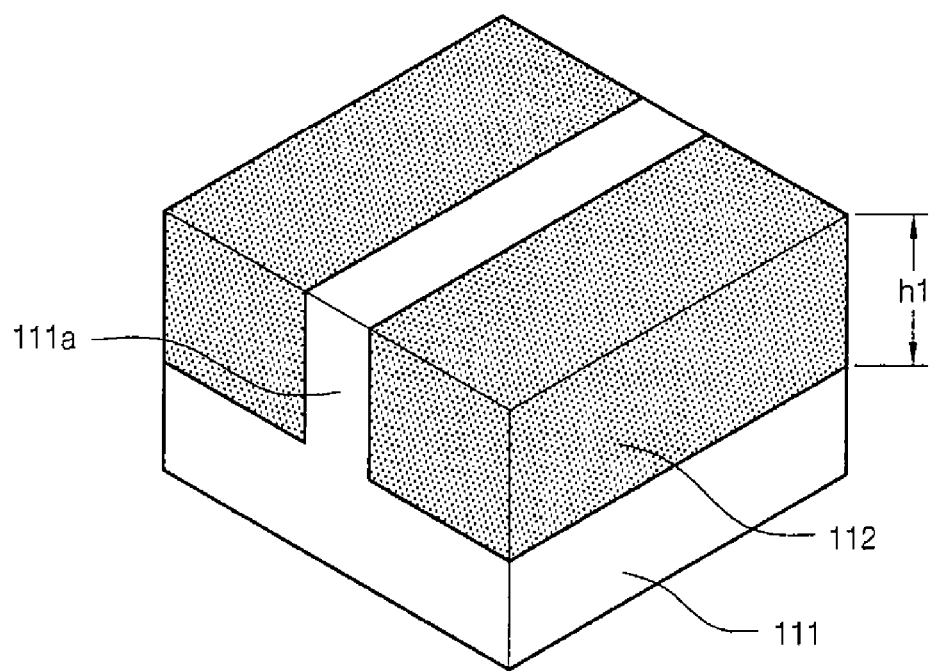

Then, as shown in FIG. 3B, a field oxide layer 112 is formed in the trench t. At this time, the field oxide layer 112 is formed with a thickness h1 of about 2000 to 6000 Å.

Figure 3C:
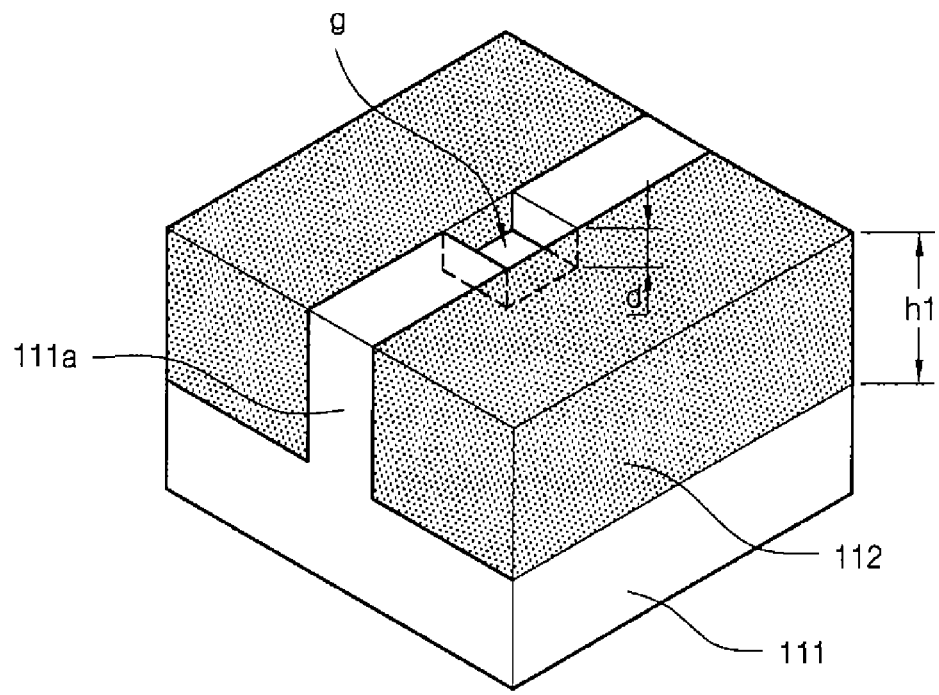

After that, a recess g having a predetermined depth is formed in a channel area of the active area 111a as shown in FIG. 3C. Preferably, the depth d of the recess g corresponds to ⅓ of the thickness h1 of the field oxide layer 112. For instance, if the thickness h1 of the field oxide layer 112 is 3000 Å, the depth d of the recess g is 1000 Å. However, the depth d of the recess g is variable and can be adjusted according to embodiments of the present invention.

Figure 3D:
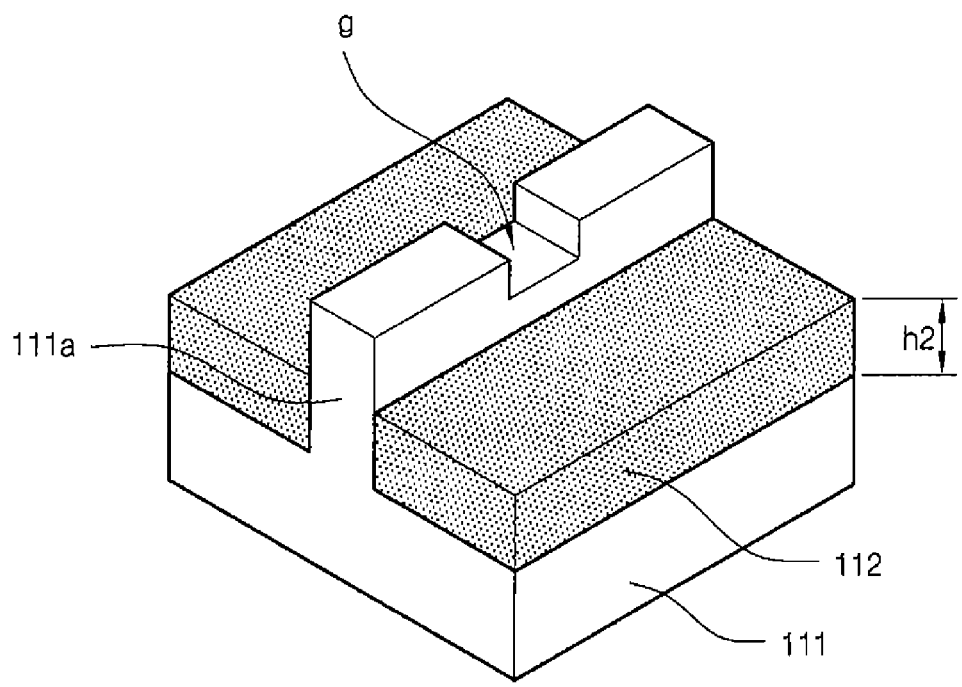

Then, as shown in FIG. 3D, the field oxide layer 112 is etched by a predetermined thickness through a wet etching process or a dry etching process. Preferably, a thickness h2 of the field oxide layer 112 obtained after the etching process corresponds to ⅓ of the thickness h1 of the field oxide layer 112. For instance, if the thickness h1 of the field oxide layer 112 is 3000 Å, the thickness h2 the field oxide layer 112 is 1000 Å. However, the thickness h2 of the field oxide layer 112 can be variously adjusted according to embodiments of the present invention. As a result, the field oxide layer 112 is positioned lower than an upper surface of the active area 111a including the recess g.

Although it has been described above that the field oxide layer 112 is etched after the recess g has been formed in the active area, it is also possible to change the order of the process steps.

Figure 3E:
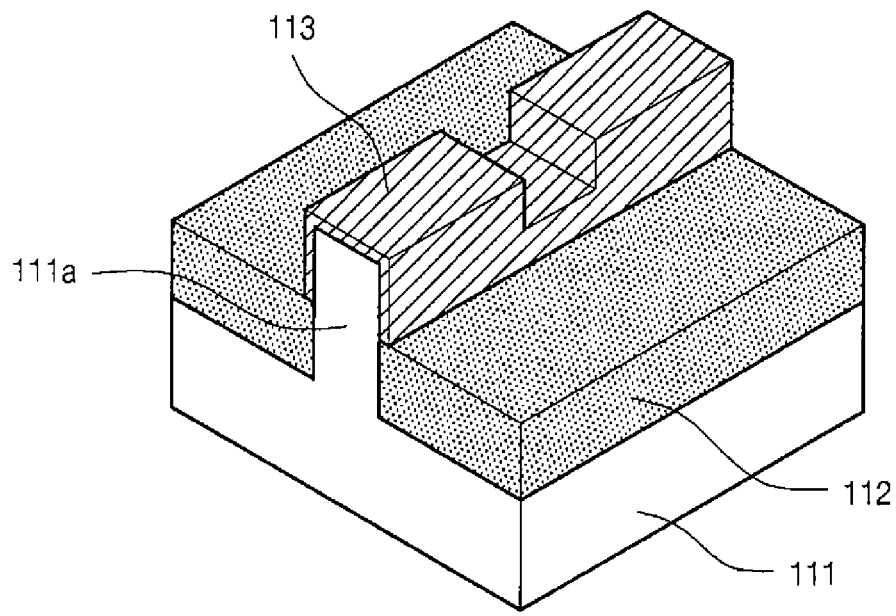

Then, as shown in FIG. 3E, a gate insulation layer 113 is formed in the active area 111a including the recess g.

Figure 3F:
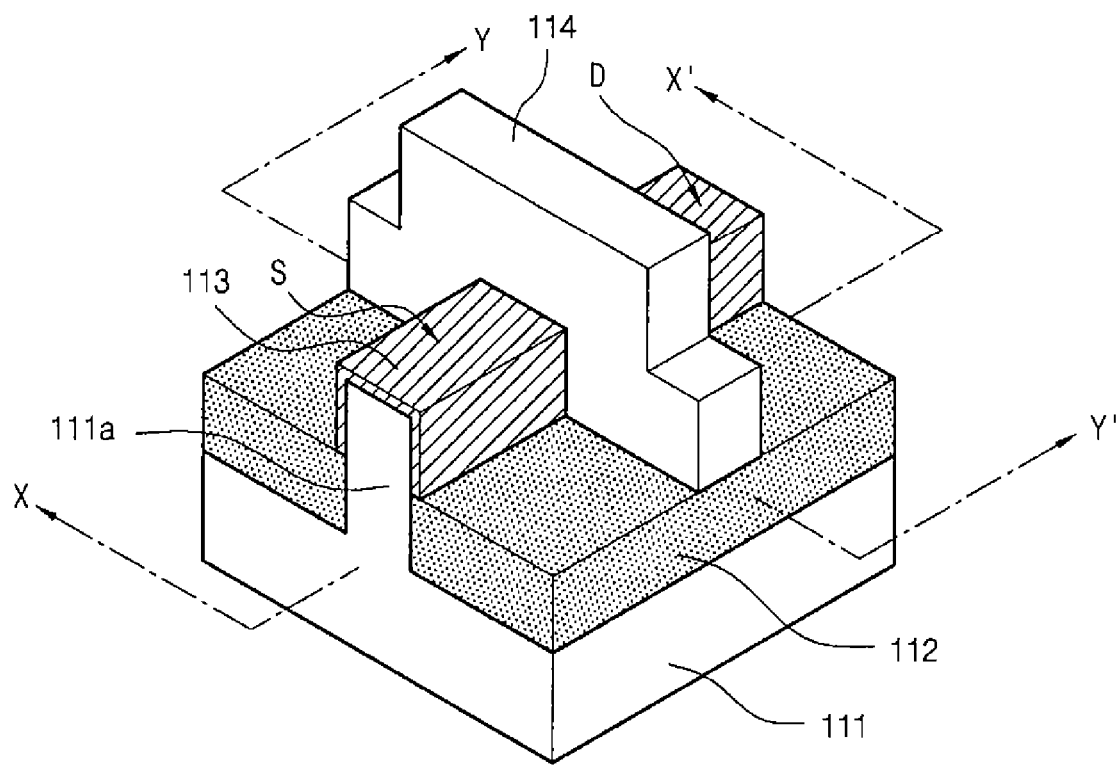

After that, as shown in FIG. 3F, a conductive layer made from polysilicon is formed on the gate insulation layer 113 and the field oxide layer 112. Then, a predetermined portion of the conductive layer is etched in such a manner that a poly gate electrode 114 can be formed across an upper portion of the active area 111a while being overlapped with the recess g formed in the channel area. Thereafter, a source area S and a drain area D are formed in the active area 111a at both sides of the poly gate electrode 114 through an ion implantation process.

Figure 4:
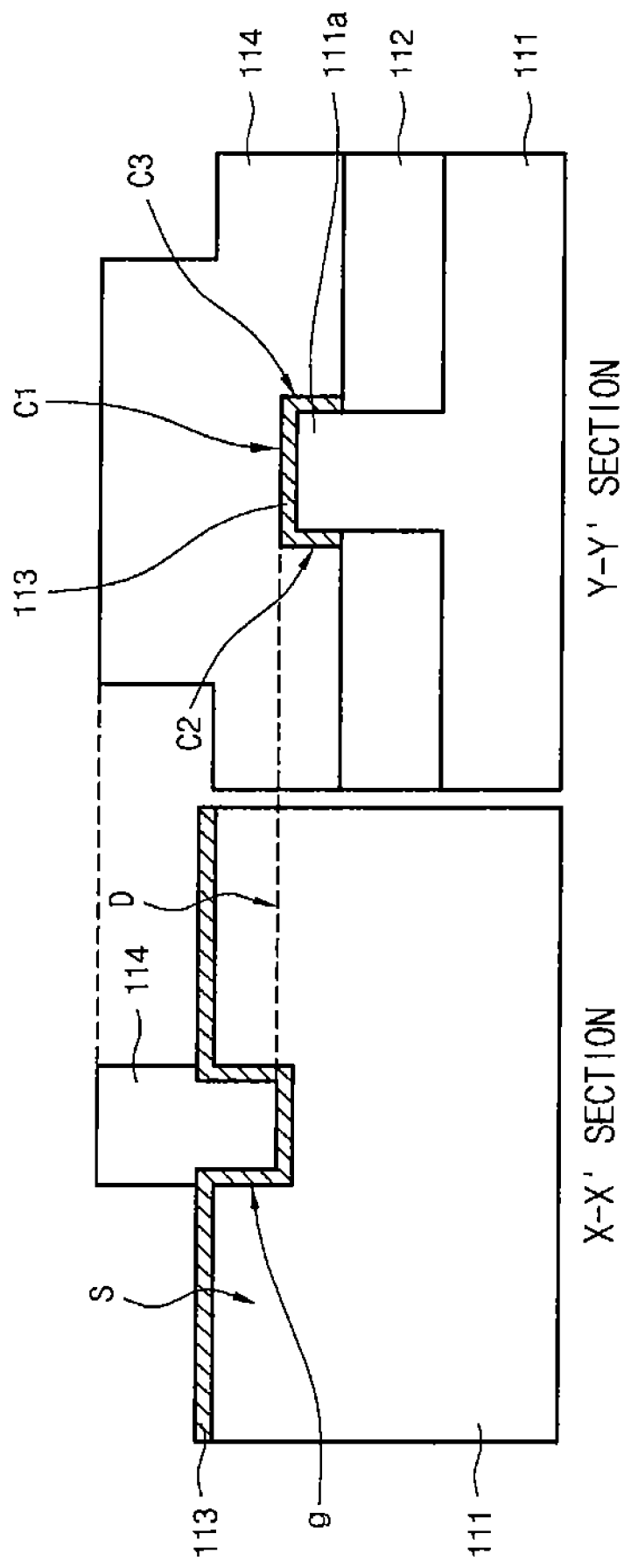
FIG. 4 is a sectional view taken along lines X and X' and Y-Y' shown in FIG. 3F.

FIG. 4 is a sectional view taken along lines X and X' and Y-Y' shown in FIG. 3F, in which reference characters C1, C2 and C3 represent channel areas.

It can be understood from FIG. 4 that the transistor according to the first embodiment of the present invention has the following structure. That is, the transistor includes the active area 111a protruding from a predetermined portion of the semiconductor substrate 111, and the recess g having the predetermined depth is formed in the channel area of the active area 111a. In addition, the field oxide layer 112 is formed on the semiconductor substrate 111 at a peripheral portion of the active area 111a in such a manner that the field oxide layer 112 is positioned lower than the upper surface of the active area 111a having the recess g, and the gate electrode 114 is formed across the upper portion of the active area 111a while being overlapped with the recess g formed in the channel area. In addition, the gate insulation layer 113 is interposed between the gate electrode 114 and the active area 111a. The source and drain areas S and D are formed on the active area 111a at both sides of the gate electrode 114.

Therefore, the transistor represents the recessed transistor structure if the transistor is sectioned along source-drain line X-X', and represents the Fin transistor structure having three surfaces (C1, C2, and C3) used for channels if the transistor is sectioned along gate line Y-Y'. Thus, the recessed transistor and the Fin transistor may be integrated as one transistor.

Such a transistor structure may have advantages of the recessed transistor and the Fin transistor, so that the transistor structure can ensure sufficient data retention times and improve the current drivability while lowering the back bias dependency of the threshold voltage.

FIGS. 5A to 5H are views illustrating a process procedure for fabricating a unit transistor having a low-resistant gate electrode according to a second embodiment of the present invention. Hereinafter, a method for fabricating the unit transistor will be described in detail with reference to FIGS. 5A to 5H.

Figure 5A:
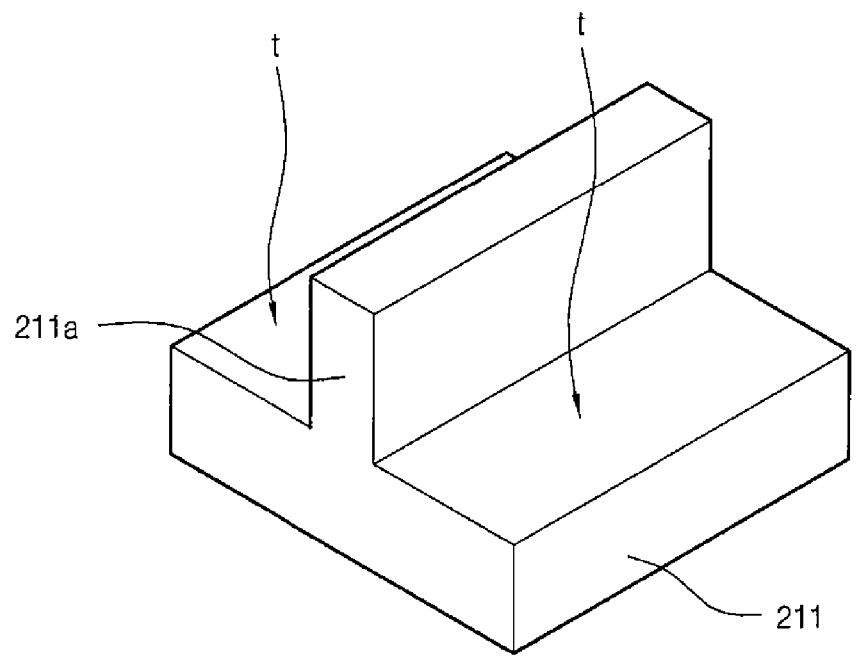
FIGS. 5A to 5H are views illustrating a process procedure for fabricating a unit transistor having a low-resistant gate electrode according to a second embodiment of the present invention.

As shown in FIG. 5A, a trench t is formed in a semiconductor substrate 211 by etching a predetermined portion of the semiconductor substrate 211. As a result, an active area 211a protrudes from the semiconductor substrate 211.

Figure 5B:
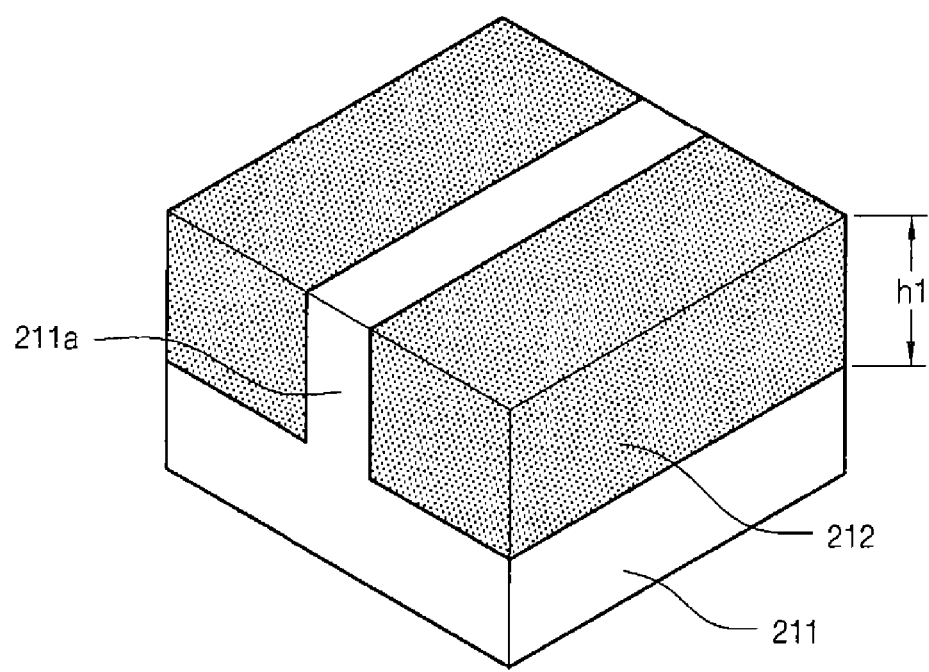

Then, as shown in FIG. 5B, a field oxide layer 212 is formed in the trench t. Then, the field oxide layer 212 is formed with a thickness h1 of about 2000 to 6000 Å.

Figure 5C:
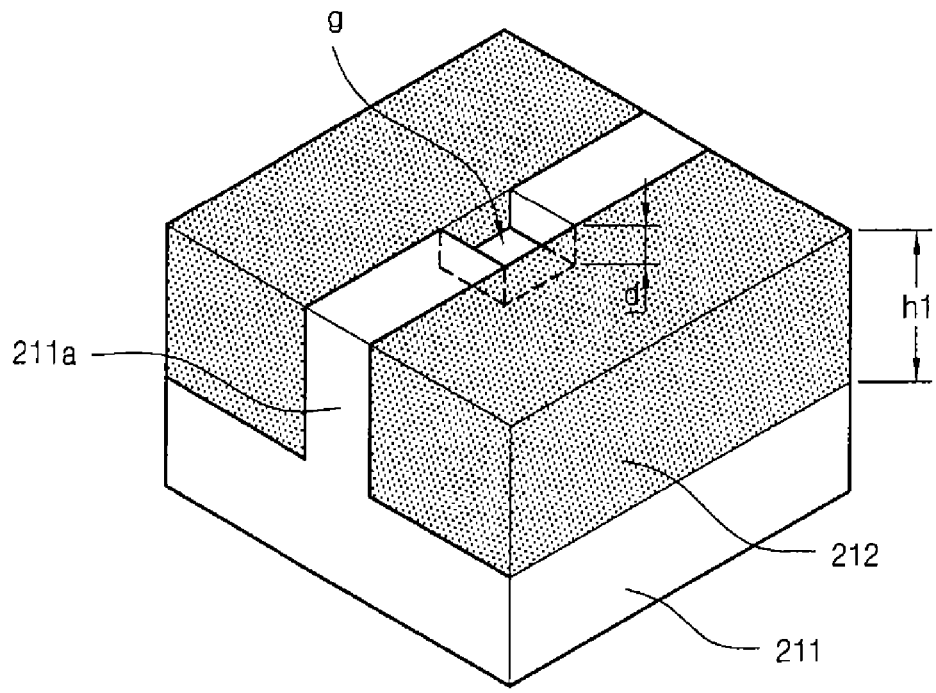

After that, a recess g having a predetermined depth is formed in a channel area of the active area 211a as shown in FIG. 5C. Preferably, the depth d of the recess g corresponds to ⅓ of the thickness h1 of the field oxide layer 212. However, the depth d of the recess g can be variously adjusted according to embodiments of the present invention.

Figure 5D:
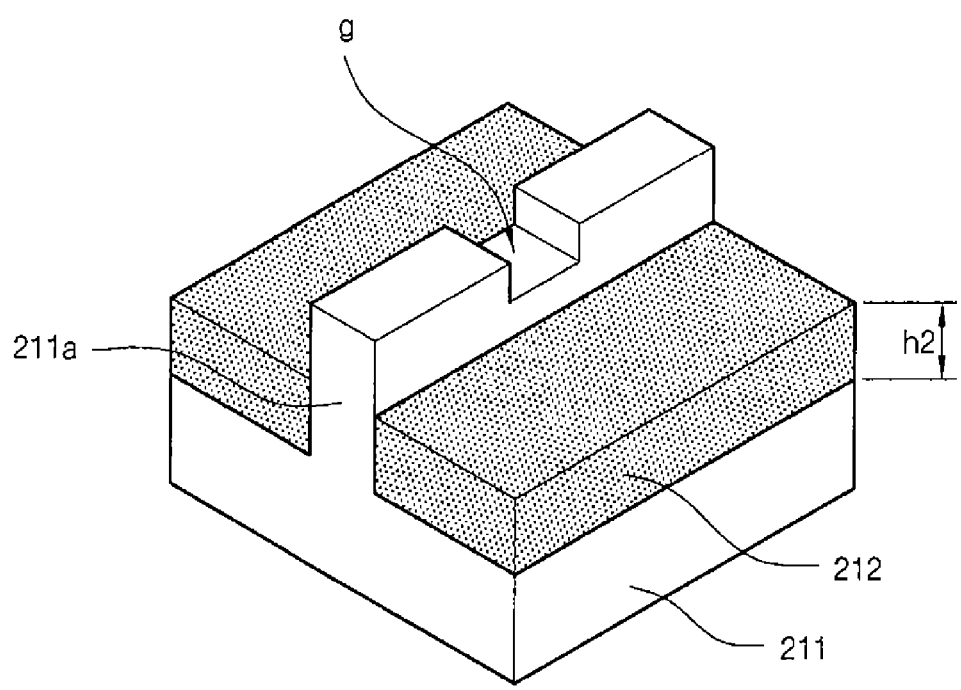

Then, as shown in FIG. 5D, the field oxide layer 212 is etched by a predetermined thickness through a wet etching process or a dry etching process. Preferably, a thickness h2 of the field oxide layer 212 obtained after the etching process corresponds to ⅓ of the thickness h1 of the field oxide layer 212. However, the thickness h2 of the field oxide layer 212 is variable and can be adjusted according to embodiments of the present invention. As a result, the field oxide layer 212 is positioned lower than an upper surface of the active area 211a including the recess g.

Although it has been described above that the field oxide layer 212 is etched after the recess g has been formed in the active area, it is also possible to form the recess g after etching the field oxide layer 212.

Figure 5E:
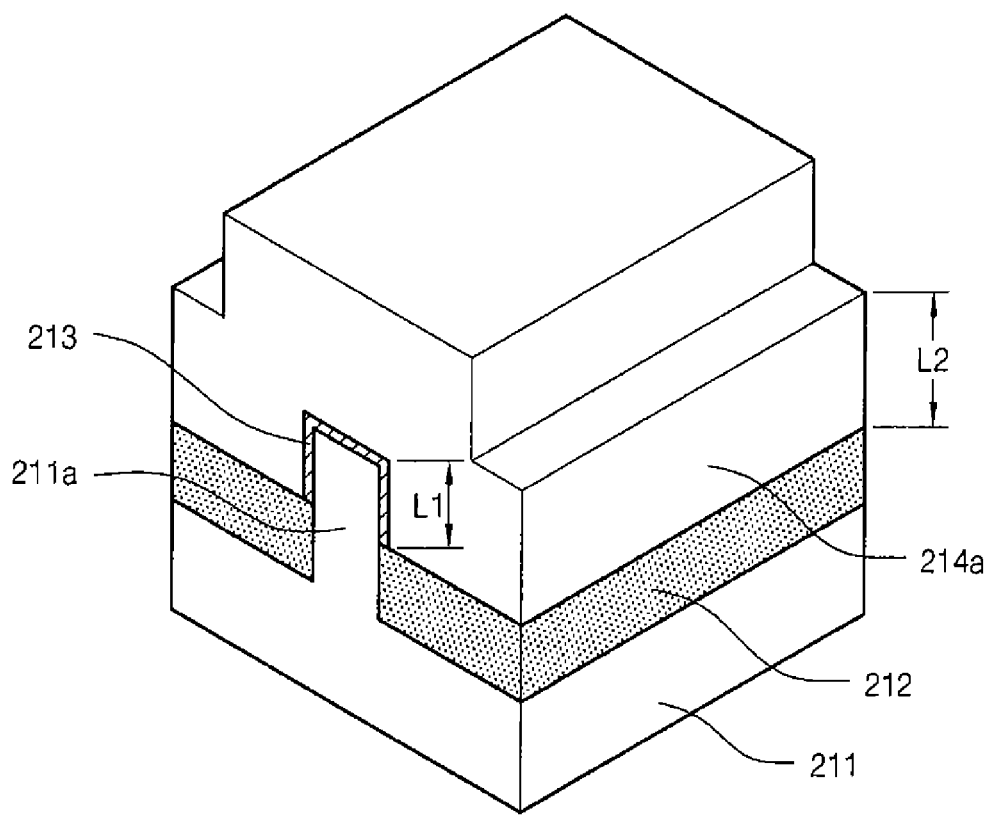

Then, as shown in FIG. 5E, a gate insulation layer 213 is formed in the active area 211a including the recess g exposed to an exterior, and a first conductive layer 214a made from polysilicon is formed on the gate insulation layer 213. As a result, the first conductive layer 214a has a thickness L2 larger than the thickness L1 of the active area 211a which is formed prior to the first conductive layer 214a by etching the field oxide layer.

Figure 5F:
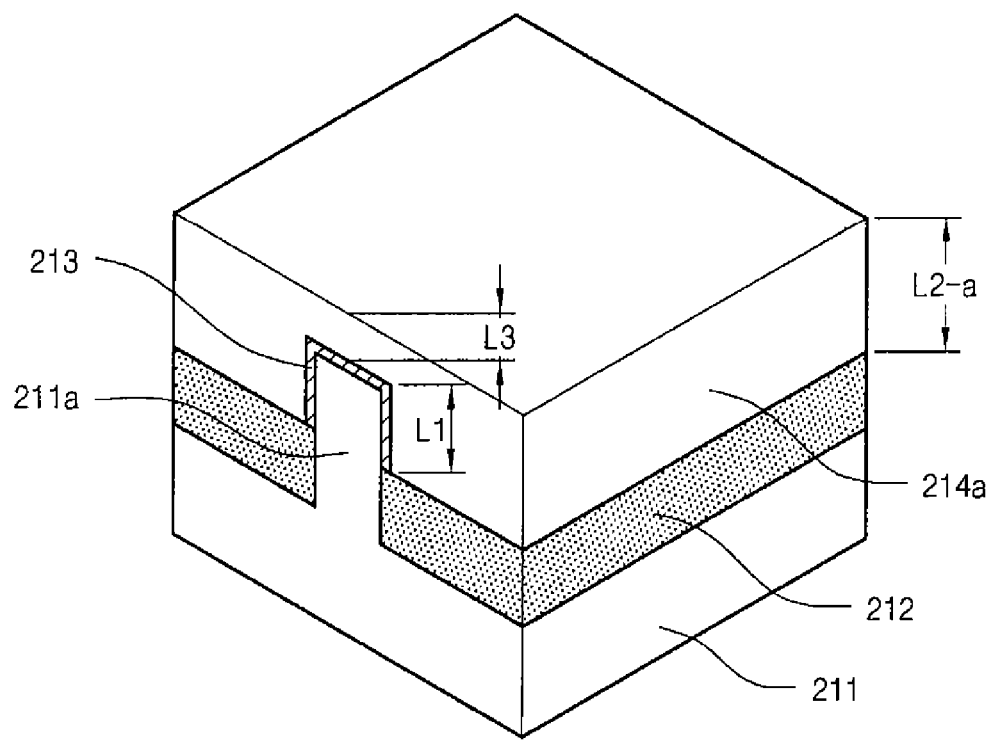

After that, as shown in FIG. 5F, the first conductive layer 214a is planarized through a CMP (chemical mechanical polishing) process. Preferably, the first conductive layer 214 formed on the upper surface of the active area 211a has a thickness L3 of about 1500 Å after the CMP process has been completed. As a result, the first conductive layer 214a remains on the field oxide layer 212 with a thickness (L2-α). In addition, the first conductive layer 214a having the thickness L3 remains on the upper surface of the field oxide layer 212. Since the first conductive layer 214a is planarized, it is possible to prevent voids from being created in deposited layers during the following processes (for example, a process for forming a second conductive layer made from a low-resistant material) caused by the step difference between the active area 211a protruding from the semiconductor substrate 211 and the field oxide layer 212.

Figure 5G:
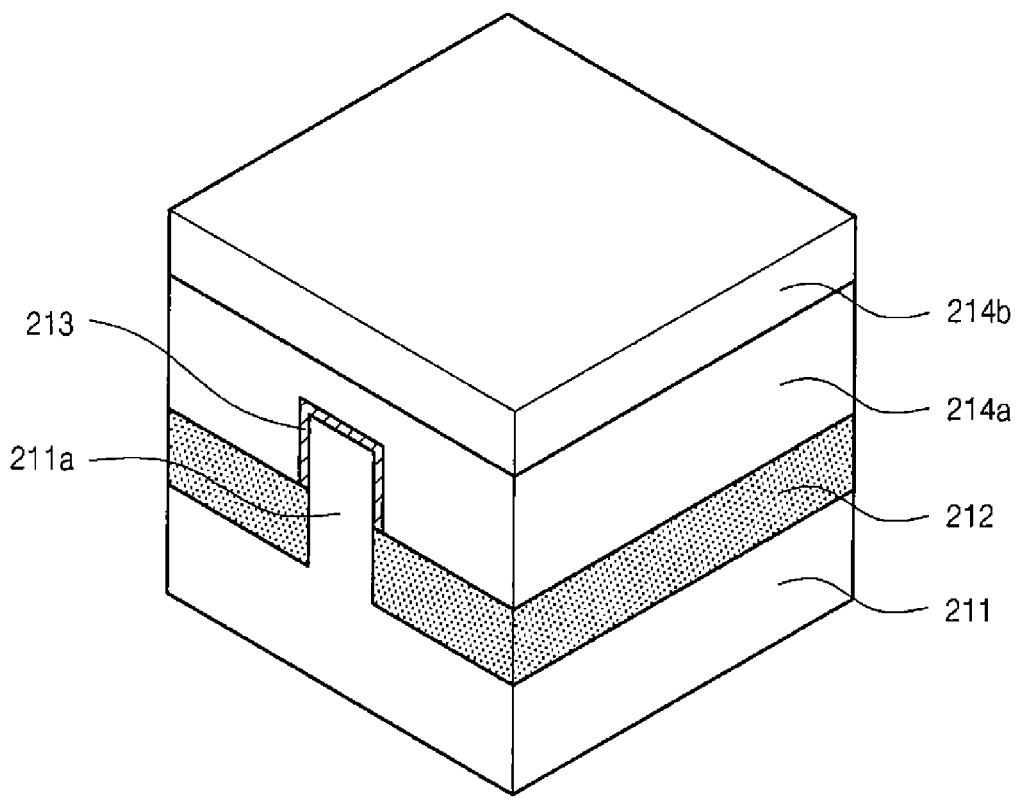

Then, as shown in FIG. 5G, a second conductive layer 214b is formed on the planarized first conductive layer 214a through a CVD (chemical vapor deposition) process or a PVD (physical vapor deposition) process. The second conductive layer 214b is made from a low-resistant material, such as W, WN, WSix or TiSix.

Figure 5H:
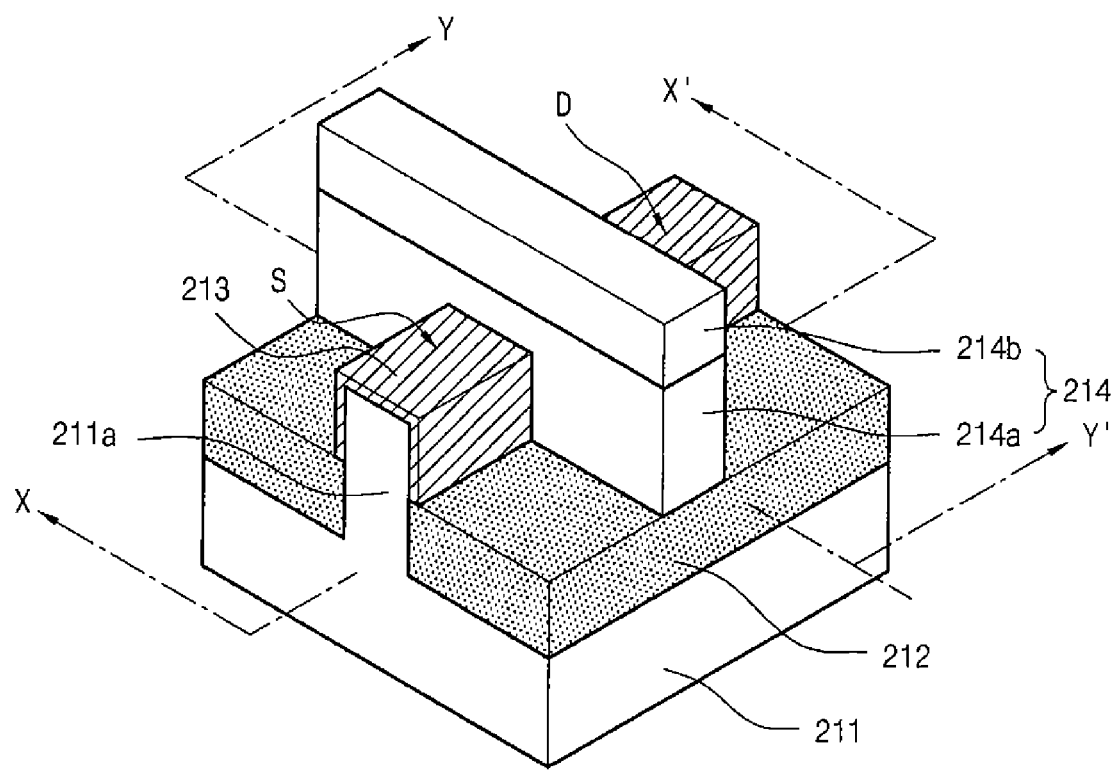

Thereafter, as shown in FIG. 5H, predetermined portions of the first and second conductive layers 214a and 214b are sequentially etched in such a manner that a low-resistant gate electrode 214 can be formed across the upper portion of the active area 211a while being overlapped with the recess g formed in the channel area. At this time, the low-resistant gate electrode 214 has a stacked structure including the first conductive layer 214a made from polysilicon and the second conductive layer 214b made from the low-resistant material and deposited on the first conductive layer 214a. After that, a source area S and a drain area D are formed in the active area 211a at both sides of the low-resistant gate electrode 214 through an ion implantation process.

Figure 6:
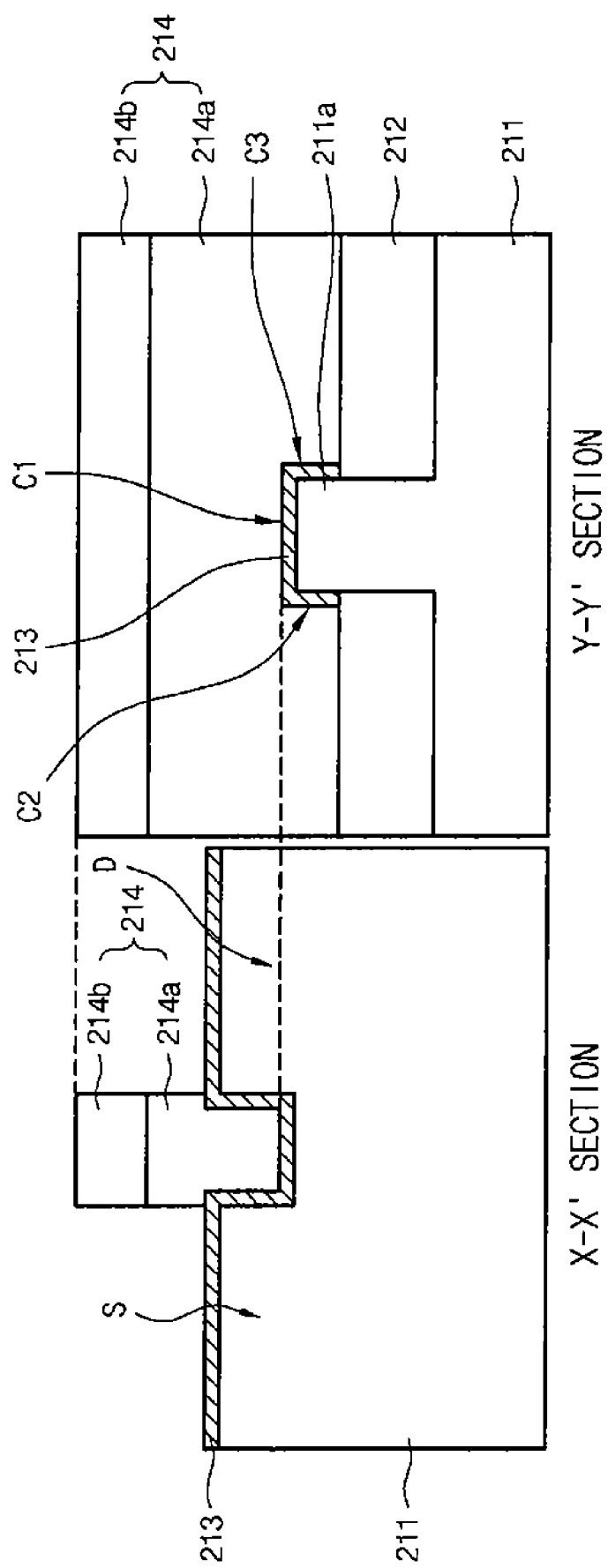
FIG. 6 is a sectional view taken along lines X and X' and Y-Y' shown in FIG. 5H.

FIG. 6 is a sectional view taken along lines X and X' and Y-Y' shown in FIG. 5H, in which reference characters C1, C2 and C3 represent channel areas.

It can be understood from FIG. 6 that the transistor structure according to the second embodiment of the present invention is substantially identical to the transistor structure according to the first embodiment of the present invention except that the poly gate electrode 114 is replaced with the low-resistant gate electrode 214.

Therefore, the transistor according to the second embodiment of the present invention also represents the recessed transistor structure if the transistor is sectioned along source-drain line X-X' and represents the Fin transistor structure having three surfaces (C1, C2, and C3) used for channels if the transistor is sectioned along gate line Y-Y'. Therefore, the recessed transistor and the Fin transistor may be integrated as one transistor according to the second embodiment of the present invention.

Accordingly, the memory device having the transistor structure shown in FIG. 5H may represent superior current drivability and ensure sufficient data retention times while lowering the back bias dependency of a threshold voltage.

In addition, according to one embodiment of the present invention, since the low-resistant gate electrode 214 is fabricated by depositing the second conductive layer 214b made from the low-resistant material on the first conductive layer 214a made from polysilicon after planarizing the first conductive layer 214a through the CMP process, voids cannot be formed in the low-resistant gate electrode 214. As a result, it is possible to prevent resistance of the gate electrode from being increased due to the voids.

As described above, according to the present invention, the recessed transistor and the Fin transistor are integrated as one transistor in such a manner that the transistor structure can ensure sufficient data retention times and improve current drivability while lowering the back bias dependency of a threshold voltage. In addition, according to one embodiment of the present invention, since the second conductive layer made from low-resistant materials, such as W, WN, WSix or TiSix, is deposited on the first conductive layer after planarizing the first conductive layer, voids cannot be formed in the low-resistant gate electrode so that it is possible to prevent resistance of the gate electrode from being suddenly increased.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor memory device, the method comprising:
   forming an active area protruding from a predetermined portion of a semiconductor substrate by etching the semiconductor substrate;
   forming a field oxide layer defining the active area in the semiconductor substrate;
   forming a recess in a channel area provided in the active area;
   etching the field oxide layer in such a manner that the field oxide layer is positioned lower than an upper surface of the active area including the recess;
   forming a gate insulation layer over the active area in which the recess and the upper surface of the active area are exposed; and
   forming a gate electrode over the gate insulation layer and the field oxide layer in such a manner that the gate electrode extends across an upper portion of the active area and overlaps with the recess.

2. The method as claimed in claim 1, wherein the etching step is performed before the forming-a-recess step.

3. The method as claimed in claim 1, wherein the field oxide layer has a thickness of about 2000 to 6000 Å.

4. The method as claimed in claim 1, wherein the recess has a depth corresponding to ⅓ of a thickness of the field oxide layer formed in the forming-a-field-oxide layer step.

5. The method as claimed in claim 1, wherein the field oxide layer is etched in such a manner that the field oxide layer has a thickness corresponding to ⅓ of a thickness of the field oxide layer formed in the forming-a-field-oxide layer step.

6. The method as claimed in claim 1, wherein the gate electrode includes a poly gate electrode or a low-resistant gate electrode.

7. The method as claimed in claim 6, wherein, if the gate electrode is the low-resistant gate electrode, the forming a gate electrode step includes:
   forming a first conductive layer made from polysilicon over the field oxide layer including the gate insulation layer;
   planarizing the first conductive layer;
   forming a second conductive layer made from a low-resistant material over the planarized first conductive layer; and
   sequentially etching predetermined portions of the first and second conductive layers,
   wherein the second conductive layer is more conductive than the first conductive layer.

8. The method as claimed in claim 7, wherein the second conductive layer is made from one selected from the group consisting of W, WN, WSix and TiSix.

9. The method as claimed in claim 8, wherein the second conductive layer is formed using a chemical vapor deposition process or a physical vapor deposition process.

10. The method as claimed in claim 7, wherein the first conductive layer has a thickness greater than a thickness of the active area which is exposed to an exterior after the forming-a-gate electrode has been performed.

11. The method as claimed in claim 7 wherein the first conductive layer is planarized in such a manner that the first conductive layer having a thickness of about 300 to 1500 Å remains overlying the upper surface of the active area.

12. The method as claimed in claim 7 wherein the first conductive layer is planarized through a chemical mechanical polishing process.

* * * * *